United States Patent
Yamazaki et al.

[11] Patent Number: 5,906,308
[45] Date of Patent: May 25, 1999

[54] CAPILLARY FOR USE IN A WIRE BONDING APPARATUS

[75] Inventors: Nobuto Yamazaki, Kunitachi; Minoru Torihata; Tatsunari Mii, both of Musashimurayama, all of Japan

[73] Assignee: Kabushiki Kaisha Shinkawa, Tokyo, Japan

[21] Appl. No.: 08/915,819

[22] Filed: Aug. 21, 1997

[30] Foreign Application Priority Data

Aug. 21, 1996 [JP] Japan ................................. 8-238542

[51] Int. Cl.$^6$ ..................... H01L 21/603; H01L 21/607
[52] U.S. Cl. .............................. 228/4.5; 228/55
[58] Field of Search .................. 228/1.1, 4.5, 51, 228/110.1, 180.5, 55

[56] References Cited

U.S. PATENT DOCUMENTS

| | | | |
|---|---|---|---|
| 4,821,944 | 4/1989 | Tsumura | 228/4.5 |
| 4,886,200 | 12/1989 | Tsumura | 228/1.1 |
| 4,911,350 | 3/1990 | Araki et al. | 228/1.1 |
| 4,955,523 | 9/1990 | Carlommagno et al. | 228/4.5 |
| 5,421,503 | 6/1995 | Perlberg et al. | 228/4.5 |
| 5,558,270 | 9/1996 | Nachon et al. | 228/4.5 |

FOREIGN PATENT DOCUMENTS

| | | |
|---|---|---|
| S57-87143 | 5/1982 | Japan . |
| H1-26531 | 5/1989 | Japan . |
| H1-42439 U | 12/1989 | Japan . |
| H3-780 | 1/1991 | Japan . |

*Primary Examiner*—Samuel M. Heinrich
*Attorney, Agent, or Firm*—Koda & Androlia

[57] ABSTRACT

A capillary for a wire bonding apparatus having a wire threading hole and a chamfer, in which the wire threading hole is formed in two stages as first and second wire threading holes, the diameter of the first wire threading hole which is located above the second wire threading hole exceeds the diameter of a bonding wire by no more than 3 to 8 microns, the diameter of the second wire threading hole is 5 to 10 microns greater than the first hole diameter, and the depth of the second wire threading hole is 10 to 50 microns.

3 Claims, 2 Drawing Sheets

CAPILLARY FOR USE IN A WIRE BONDING APPARATUS

BACKGROUND OF THE INVENTION

1. Field of the Invention

The present invention relates to a capillary used in a wire bonding apparatus.

2. Prior Art

A prior art wire bonding method will be described first.

Various types of wire bonding methods have been proposed; and the most common method is illustrated in FIG. 4.

First, as shown in FIG. 4(a), a ball 3a is formed by means of a spark discharge created by an electric torch 5 on a wire 3 which extends from the lower end of a capillary 4, and the electric torch 5 is moved in the direction indicated by the arrow. Next, as shown in FIG. 4(b), the capillary is moved to a point above the first bonding point 1a; and as shown in FIG. 4(c), the capillary 4 is lowered so that the ball 3a on the tip end of the wire 3 is pressed against the first bonding point 1a, and an ultrasonic vibration is applied to the capillary 4 by means of a horn which is provided with the capillary 4, thus bonding the ball 3a to the first bonding point.

Afterward, as shown in FIG. 4(d), the capillary 4 is raised. Then, as shown in FIG. 4(e), the capillary 4 is moved in the looping direction A to a point above the second bonding point 2a. Then, as shown in FIG. 4(f), the capillary 4 is lowered so that the wire 3 is pressed against the second bonding point 2a, and an ultrasonic vibration is applied to the capillary 4 by the horn, thus bonding the wire 3 to the second bonding point. After the capillary 4 is raised to a given position, a damper 6 is closed, and the capillary 4 and damper 6 are raised together so that the wire 3 is cut as shown in FIG. 4(g). As a result of this operation, the connection of one wire is completed.

Japanese Patent Application Kokai (Laid-Open) No. S57-87143 and Japanese Patent Application Kokoku (Publication) No. H1-2653 1, for instance, disclose wire bonding methods of this type.

One type of conventional capillaries has, as shown in FIG. 2, a chamfer 11 formed in the tip end of the wire threading hole 10, and another type of conventional capillaries has, as shown in FIG. 3, two chamfers, i.e., lower and upper chamfers 11 and 12, which are formed in the tip end of the wire threading hole 10. In these Figures, HD indicates the hole diameter, T indicates the tip diameter, CD indicates the chamfer diameter of the lower chamfer 11, $\theta_1$ indicates the chamfer angle of the lower chamfer 11; $\theta_2$ indicates the chamfer angle of the upper chamfer 12, α indicates the face angle, and OR indicates the outer radius. Where d is the diameter of the wire 3, then the hole diameter HD is d+(8 to 12) μm (microns); in addition, $\theta_1$ is 80 to 100 degrees, and $\theta_2$ is 20 to 40 degrees.

Examples of capillaries of the type described above are disclosed in Japanese Utility Model Application Kokoku (Laid-Open) No. HI-42349 and Japanese Patent Application Kokoku (Publication) No. H3-780, etc.

The prior art capillary 4 described above which includes two chamfers, i.e., lower and upper chamfers 11 and 12, has some problems. When the ball 3a is bonded to the first bonding point 1a shown in FIG. 4, since the capillary 4 has the upper chamfer 12 as shown in FIG. 3, the total volume inside the chamfers 11 and 12 is great, and a high amount of material of the ball 3a enters the area of the upper chamfer 12. As a result, the amount of ball material outside the upper chamfer 12 becomes small, so that the diameter of the press-bonded ball becomes inevitably small.

Recently, the pads on pellets are installed at finer pitches due to a strong demand of a higher integration of semiconductor IC chips; and therefore, the diameter of the press-bonded ball becomes smaller relative to the diameter of the wire 3. In the prior art described above, the hole diameter HD of the capillary is set to be 8 to 12 microns greater than the wire diameter d, and two chamfers, i.e., lower and upper chamfers 11 and 12, are formed so that the volume of the upper chamfer 12 is greater than the lower chamfer 11; as result, it is possible to make the diameter of the press-bonded ball small when the ball 3a is bonded to the first bonding point 1a shown in FIG. 4.

The prior art described above can be used for a wire that has the diameter d in the range of 20 to 80 microns; and in cases where the diameter d of the wire 3 is as small as 10 to 30 microns, various problems arise.

In particular, when the hole diameter HD is 8 to 12 microns greater than the diameter d of the wire 3, and the chamfer angle $\theta_2$ of the upper chamfer 12 is as large as 20 to 40 degrees, then the ball 3a must inevitably be formed small in size as described above in order to reduce the diameter of the press-bonded ball in accordance with the demand of fine pitches in the semiconductor IC chips. However, when the hole diameter HD is 8 to 12 microns greater than the diameter d of the wire 3, and the chamfer angle $\theta_2$ of the upper chamfer 12 is as large as 20 to 40 degrees as described above, the ball is contacted by the edge part 13 which is at the lower end of the chamfer 12.

When bonding is performed under such conditions, the ball 3a is cut by the edge part 13 in the initial stage when the capillary 4 is lowered; and the portion of the ball directly beneath the upper chamfer 12 enters the wire threading hole 10 through the upper chamfer 12, while the remaining portions of the ball gradually make contact with the lower chamfer 11 and then finally contact the entire surface of the lower chamfer 11; afterward, the ball material enters the area defined by the face angle α. In this case, the force required for bonding cannot be transmitted to the portions of the ball which have entered the area of the chamfer 12 and the interior of the wire threading hole 10. As a result, the force required for bonding can be transmitted only to the portions of the ball located inside the area of the lower chamfer 11 and in the area beneath the face angle α; and the bonding force drops if the amount of ball material that has entered the area of the chamfer 12 and the interior of the wire threading hole 10 is large. Furthermore, since the portions of the ball material that have entered the area of the chamfer 12 and the wire threading hole 10 contact the side surfaces of the wire threading hole 10 in the vertical direction, friction is generated when the capillary 4 is raised. This produces a force which peels off the press-bonded ball bonded to the first bonding point la, and thus weakens the press-bonding force.

SUMMARY OF THE INVENTION

Accordingly, the object of the present invention is to provide a capillary which is used for a wire having a diameter of 10 to 30 microns so as to provide an improved ball bonding force.

The means according to the present invention which accomplishes the object is characterized by the fact that in a capillary for use in a wire bonding apparatus and has a chamfer formed in the tip end of the wire threading hole, the wire threading hole is formed in two stages as first and second wire threading holes, the hole diameter of the first wire threading hole which is located above the second wire threading hole is set so as to exceed the wire diameter by no more than 3 to 8 μm (microns), the hole diameter of the second wire threading hole is set so as to be 5 to 10 μm (microns) greater than the first hole diameter, and the height of the second wire threading hole is set to be 10 to 50 microns.

DETAILED DESCRIPTION OF THE INVENTION

Figure 1:
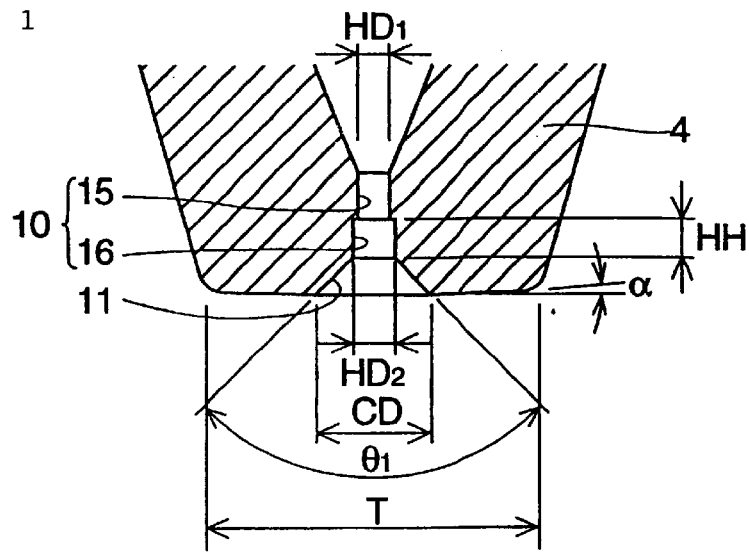
FIG. 1 is a sectional view of an embodiment of the capillary of the present invention.
Figure 2:
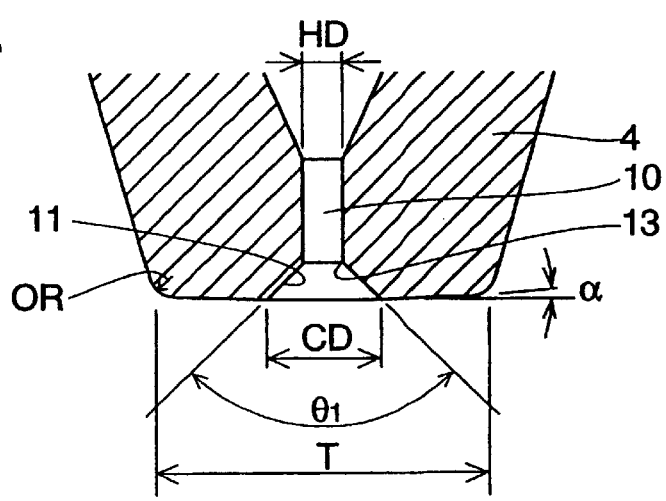
FIG. 2 is a sectional view of a conventional capillary.
Figure 3:
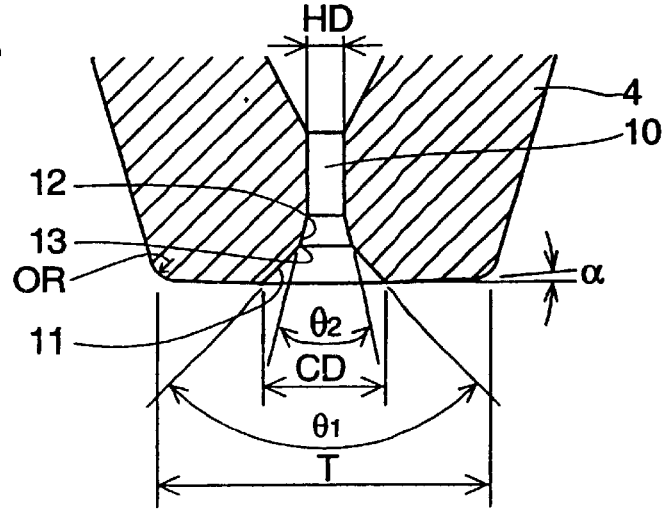
FIG. 3 is a sectional view of another conventional capillary.
Figure 4:
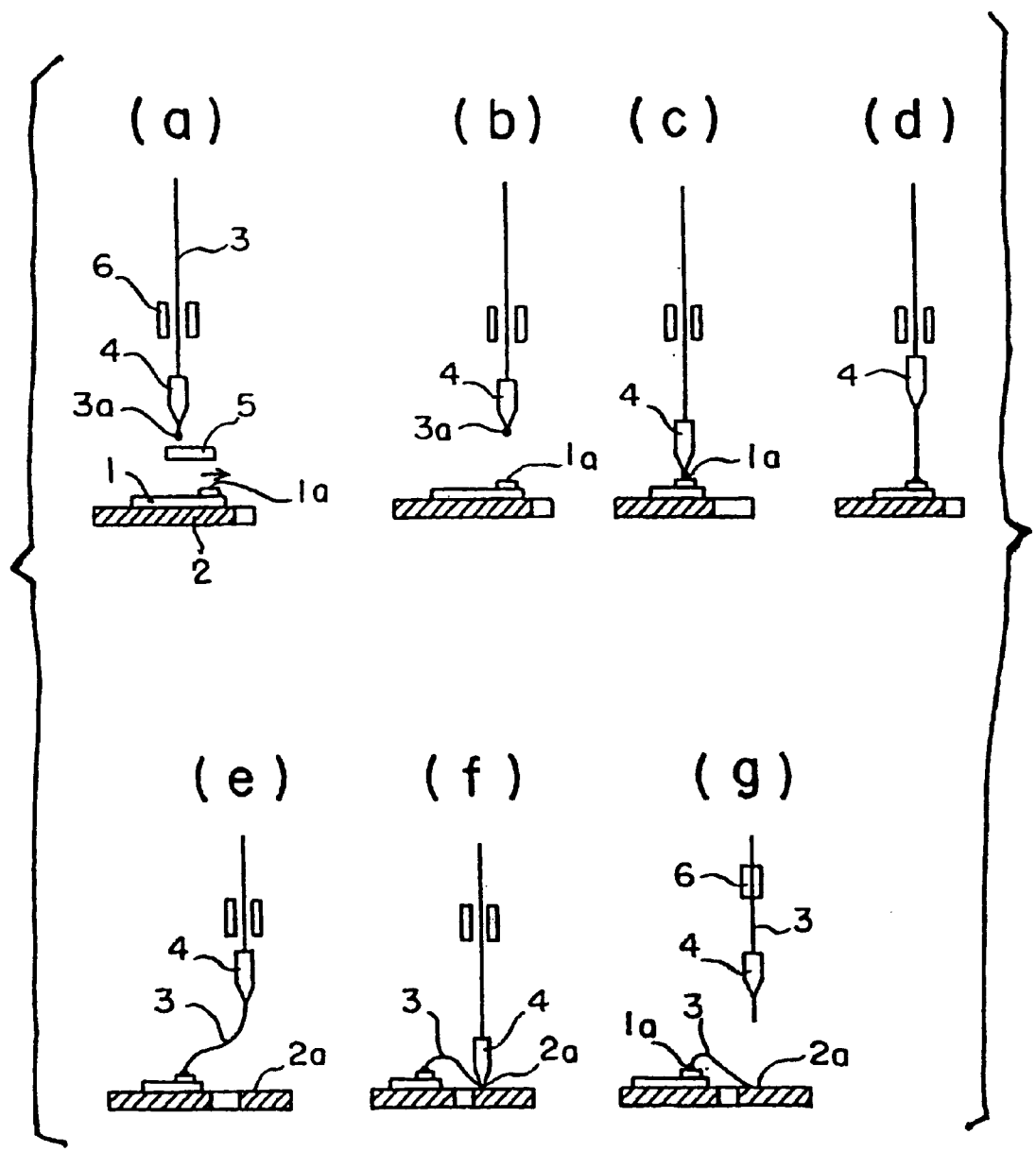
FIGS. 4(a) through 4(g) are process diagrams which illustrate a wire bonding method.

One embodiment of the present invention will be described with reference to FIG. 1. Elements which are the same as those in FIGS. 2 and 3 or elements which correspond to those shown in FIGS. 2 and 3 are labeled with the same symbols.

In the shown embodiment, the wire threading hole 10 of a capillary 4 is formed in two stages so that the hole 10 has first and second wire threading holes 15 and 16. The first hole diameter $H_1$, of the first wire threading hole 15 which is located above the second wire threading hole 16 is set at a value which exceeds the wire diameter d by no more than 3 to 8 μm (microns), and the second hole diameter $HD_2$ of the second wire threading hole 16 is set to be 5 to 10 μm (microns) greater than the first hole diameter $HD_1$. In addition, the height HH of the second wire threading hole 16 is set to be 10 to 50 μm (microns). The chamfer angle δ, is set at 80 to 100 degrees as in a conventional capillary.

In the capillaries shown in Japanese Utility Model Application Publication (Kokoku) No. 1-42349 and Japanese Patent Application Publication (Kokoku) No. 3-780 (see FIG. 3), the wire used in these capillaries have a diameter d of 20 to 80 microns, and the hole diameter HD of the capillary is set to be d+(8 to 12) microns, and the chamfer angle $\theta_2$ is 20 to 40 degrees. Thus, the wires having a small wire diameter d of 30 microns or less can be used in these capillaries. However, if a wire having a wire diameter d which is in the range of 10 to 30 microns is used, the results obtained by these conventional capillaries are not desirable. In the embodiment of the present invention, the first hole diameter $HD_1$ is d+(3 to 8) μm or less, which is smaller than the hole diameter of a capillary of a conventional capillary; and the second hole diameter $HD_2$ is $HD_1$+(5 to 10) μm, which is substantially the same as the hole diameter HD of a conventional capillary. Accordingly, when a wire having the wire diameter d in the range of 10 to 30 microns is used, at the time of bonding to the first bonding point 1a, the amount of material of the crushed ball 3a that enters the first wire threading hole 15 is restricted by the step part formed (by the difference in the diameters of the first and second wire threading holes) at the top of the second wire threading hole 16. In other words, the amount of ball material that enters the first wire threading hole 15 is small; and therefore, the amount of the ball material that is crushed by the chamfer 11 increases if the ball 3a is small due to the wire having a small wire diameter d, thus, an increased press-bonding force is obtainable.

Though the first hole diameter $HD_1$ is small, i.e., no greater than d+(3 to 8) μm, the second hole diameter $HD_2$ is substantially the same as the hole diameter HD of a conventional capillary; accordingly, bonding to the second bonding point 2a is accomplished by substantially the same operation as in a conventional device. Furthermore, when a wire having the wire diameter d of 10 to 30 microns is used, there is a little crushing of the wire 3 during bonding to the second bonding point 2a; accordingly, flow (spreading) of the crushed wire 3 does not present any great problems.

As seen from the above, according to the present invention, the wire threading hole has two stages, first and second wire threading holes, and the diameter of the first wire threading hole which is located above the second wire threading hole is set so as to exceed the wire diameter by no more than 3 to 8 microns, the second wire threading hole is set so that the hole diameter thereof is 5 to 10 microns greater than the hole diameter of the first wire threading hole, and the height of the second wire threading hole is set at 10 to 50 microns. Accordingly, a capillary that has a hole shape which improves bondability is obtained.

We claim:

1. A capillary for use in a wire bonding apparatus in which a chamfer is formed in the tip end of a wire threading hole, said capillary being characterized in that: said wire threading hole is formed in two stages as first and second wire threading holes, a first hole diameter of the first wire threading hole, which is located above said second wire threading hole, is set so that said first hole diameter exceeds a wire diameter by no more than 3 to 8 microns, a second hole diameter of said second wire threading hole is set so that said second hole diameter is 5 to 10 microns greater than said first hole diameter, and the height of the second wire threading hole is set at 10 to 50 microns.

2. A capillary for use in a wire bonding apparatus comprising a wire threading hole and a chamfer formed under said wire threading hole so that a bonding wire passes through said wire threading hole and chamfer, wherein said wire threading hole is divided into upper and lower portions arranged in vertical directions so that said upper portion has a smaller diameter than said lower portion and a stepped portion is formed between said upper and lower portions.

3. A capillary according to claim 2, wherein a diameter of said upper portion exceeds a diameter of said wire by no more than 3 to 8 microns, a diameter of said lower portion is 5 to 10 microns greater than said diameter of said upper portion, and the height of the lower portion is 10 to 50 microns.

* * * * *